United States Patent
Tseng et al.

[11] Patent Number: 6,032,355
[45] Date of Patent: Mar. 7, 2000

[54] METHOD OF FORMING THERMAL CONDUCTIVE STRUCTURE ON PRINTED CIRCUIT BOARD

[75] Inventors: Tzyy-Jang Tseng, Hsinchu; David C. H. Cheng, Taoyuan Hsien, both of Taiwan

[73] Assignee: World Wiser Electronics, Inc., Taoyuan Hsien, Taiwan

[21] Appl. No.: 09/130,360

[22] Filed: Aug. 6, 1998

[30] Foreign Application Priority Data

Apr. 22, 1998 [TW] Taiwan ................................. 87106140

[51] Int. Cl.⁷ ..................................................... H05K 3/34
[52] U.S. Cl. ................................................. 29/840; 29/846
[58] Field of Search ............................... 29/825, 832, 833, 29/834, 846, 840; 174/16.3

[56] References Cited

U.S. PATENT DOCUMENTS

| | | | |
|---|---|---|---|
| 4,294,009 | 10/1981 | Quintin et al. | 29/846 X |
| 4,936,010 | 6/1990 | Siuzdak | 29/846 X |
| 5,471,027 | 11/1995 | Call et al. | 29/841 X |
| 5,592,735 | 1/1997 | Ozawa et al. | 29/846 X |
| 5,661,089 | 8/1997 | Wilson | 29/841 X |

FOREIGN PATENT DOCUMENTS 2-111057 4/1990 Japan.

OTHER PUBLICATIONS

IBM Technical Disclosure Bulletin vol. 31 No. 8 Jan. 1989 pp. 135–138.

IBM Technical Disclosure Bulletin vol. 38 No. 8 Aug. 1995, pp. 547–548.

*Primary Examiner*—Carl J. Arbes
*Attorney, Agent, or Firm*—Thomas, Kayden, Horstemeyer & Risley

[57] ABSTRACT

A method of manufacturing a thermal conductive structure on a printed circuit board comprises the steps of forming a thermal conductive layer having an embossed pattern on its surface, and then forming an adhesive glue layer over the thermal conductive layer. Next, a surface metallic layer is attached to the thermal conductive layer and the glue layer, wherein a portion of the surface metallic layer corresponding to the embossed portion of the heat spreader is in direct contact or almost direct contact with the thermal conductive layer. Furthermore, an additional external heat sink can be attached to thermal conductive structure for increasing the efficiency of heat dissipation.

31 Claims, 5 Drawing Sheets

METHOD OF FORMING THERMAL CONDUCTIVE STRUCTURE ON PRINTED CIRCUIT BOARD

CROSS-REFERENCE TO RELATED APPLICATION

This application claims the priority benefit of Taiwan application Ser. No. 87106140, filed Apr. 22, 1998, the full disclosure of which is incorporated herein by reference.

BACKGROUND OF THE INVENTION

1. Field of Invention

The present invention relates to a method of forming an ultra-high efficiency thermal conductive structure on a printed circuit board (PCB). More particularly, the present invention relates to a packaging method that utilizes an ultra-high efficiency thermal conductive structure.

2. Description of Related Art

In a module that contains an integrated circuit (IC), a large number of conductive wires normally emanate from the IC chip. Hundreds of connections have to be made externally to complete the circuit. In the past, there have been a variety of different circuit connections and packaging methods. The most commonly used packaging methods include planar packaging, hermetic and plastic chip carrier packaging, and grid array packaging.

Among the conventionally used packaging methods for IC chips, packages that includes a lead frame and a number of connective wires to connect between a semiconductor chip and external terminals are quite common. However, as the integrated circuit becomes more precise and interconnection becomes more complicated, the number of wires necessary for connecting the chip to the outside world soars. Therefore, conventional techniques that rely on wiring connection to a lead frame gradually become highly deficient. Consequently, new packaging method that can accommodate more wiring connections and more complicated circuits are being developed.

Currently, one type of packaging that can accommodate more wiring connections and more complicated circuits is a ball grid array (BGA). The BGA is a square array type of packaging where the wiring terminals are solder balls. These wiring terminals are fabricated into solder balls so they can be easily attached to the bonding pads of a printed wire board (or printed circuit board) or the surface of an appropriate device.

In reality, a conventional BGA type of connection can be regarded as a miniaturized multi-layered printed circuit board that connects an IC chip with external terminals through a series of internal conductors. These internal conductors are in turn connected by through holes in a metallic layer or metallic plugs.

In a conventional cavity-down type of BGA package, two or more metallic layers are compressed together and attached to a peripheral region of the substrate. These metallic layers are labeled as 108 and 112 in FIG. 1, which is a cross-sectional view showing a conventional ball grid array package. FIG. 1a is a magnified view showing the conductive layer of the first conventional package structure as shown in FIG. 1. The overall thickness of these metallic layers limits the maximum height of the solder balls. Since most IC chips have a thickness comparable or slightly thicker than the solder balls, the BGA package may act as a barrier to contacts between the solder balls and the printed circuit board. Hence, with the limitation on maximum height, it becomes preferable to mount the IC chip on one side of the substrate and then mount the solder balls on the opposite side of the substrate. However, with this arrangement, electrical connection between the chip and the solder balls must be achieved through metallic layers on both sides of the substrate and additional holes and plugs that penetrate through the substrate. Although this method can accommodate a large number of wiring connections, the manufacturing process is complicated and its production cost is high. For example, the substrate has to be specially made, holes and plugs have to be specially formed in the substrate, and the substrate and the metallic layers have to be specially joined together. At present, methods of cooling a package include the installation of a heat sink on the top of the chip, or drilling a hole underneath the chip that penetrates the substrate and the metallic layer. However, these methods not only increase the number of manufacturing steps, but also increase the cost of production as well.

To resolve the aforementioned problems, a package structure that involves multi-layered printed wire board and the use of adhesive glue (Prepreg) has been proposed by LSI Logic Corporation in U.S. Pat. No. 5,357,672. FIG. 1 is a cross-sectional view showing the proposed package structure. As shown in FIG. 1, silicon chip 101 is installed inside the central cavity. The central cavity is surrounded by printed circuit boards cut out and stacked on top of each other forming a tier structure. Near the edges of the tiers are bonding pads 105. Bonding wires are used to connect the bonding pad of the IC chip to the bonding pads 105 on the edge of the printed circuit board tier. Then, from the bonding pads 105, connections are made to respective bumps 109 through the printed circuit board and through holes 107. Finally, any signals coming from the IC chip can be sent to a main board. In the patent, the structure formed by gluing the printed circuit boards together is used as a substrate, and the silicon chip is mounted in the cavity enclosed by the substrate. Hence, the silicon chip and the bumps are on the same side of the substrate. Consequently, it is not necessary to employ two conductive layers on each side of the substrate to make connection.

FIG. 2 is a perspective view showing a second package structure by Washington Electric Corporation in U.S. Pat. No. 5,027,191. The IC chip 201 is installed inside the chip carrier. The IC chip 201 is connected to the bonding pads on the bonding ledge 205 through a series of bonding wires 203. Electrical connections are also made between the bonding pads on the bonding ledge 205 to the regularly spaced contact pads 207 on the surface of the chip carrier. Hence, electrical signals coming from the IC chip can be transmitted to the main board outside. The IC chip is facedown in this type of package design. Therefore, a heat sink can be installed on the bottom surface of the printed circuit board or on the top surface of the chip carrier in order to dissipate heat.

FIG. 3 is a cross-sectional view showing a type of IC package proposed by Motorola in one of its U.S. Patent applications. As shown in FIG. 3, the package has a plastic BGA (PBGA) structure having a silicon chip 301 directly attached to a central location of the printed circuit board substrate 300. A number of bonding wires 303 are used for connecting the bonding pads on the silicon chip 301 to the bonding pads 305 on the printed circuit board. The bonding pads 305 are in turn connected to the external solder balls 307 through printed circuits and via connections. The chip and the internal wires are enclosed within a protective plastic mold. In addition, a vent hole is formed underneath the silicon chip to increase heat dissipation.

Common features of the packages described above includes their capacity for accommodating vast quantities of conductive wires inside the package, or having their silicon chip and solder balls assembled on the same side of a substrate. However, all of them require the attachment of an external heat sink. Therefore, the package becomes bulkier and mass production of the package is more difficult. Moreover, to achieve full wiring connections, the printed circuit boards has to be shaped into a multi-tier structure. Hence, cost and difficulties of production are increased.

In light of the foregoing, there is a need to provide a method of improving the thermal conductive structure inside a printed circuit board.

SUMMARY OF THE INVENTION

Accordingly, the present invention is to provide a method of forming a thermal conductive structure on a printed circuit board. In this structure, the chip mount pad is in direct contact or almost direct contact with a piece of metal, a piece of thermally conductive ceramic, or a polymer heat spreader, thereby forming the most direct heat conductive path away from a silicon chip carrier. An external heat sink can also be added so that some other portion of the heat generated by the silicon chip can be channeled away. Moreover, these thermal conductive structures are easy to manufacture and it is possible to mass-produce them at a moderate cost. Besides PCBs, the above thermal conductive structure can be applied to BGA packages, chip scale packages (CSPs) and multi-chip modules (MCM).

In another aspect, this invention provides a method of packaging silicon chips, wherein a silicon chip is placed on a chip mount pad that is in direct contact with a piece of metal, or a piece of thermally conductive ceramic, or a polymer heat spreader so that the silicon chip is connected with the most direct and most efficient thermal conductive path for heat dissipation. With the addition of an external heat sink, an additional portion of the heat generated by the silicon chip, other than the heat channeled away through some internal thermal vias, can be dissipated. .

To achieve these and other advantages and in accordance with the purpose of the invention, as embodied and broadly described herein, the invention provides a method of manufacturing a thermal conductive structure on a printed circuit board. The method includes the steps of forming a heat spreader having an embossed pattern formed on its surface, after which an adhesive glue layer is formed over the heat spreader. Next, a surface metallic layer is attached to the heat spreader and the glue layer, wherein a portion of the surface metallic layer is in direct contact or almost direct contact with the heat spreader. Furthermore, an additional external heat sink can be attached to the thermal conductive structure for increasing the efficiency of heat dissipation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
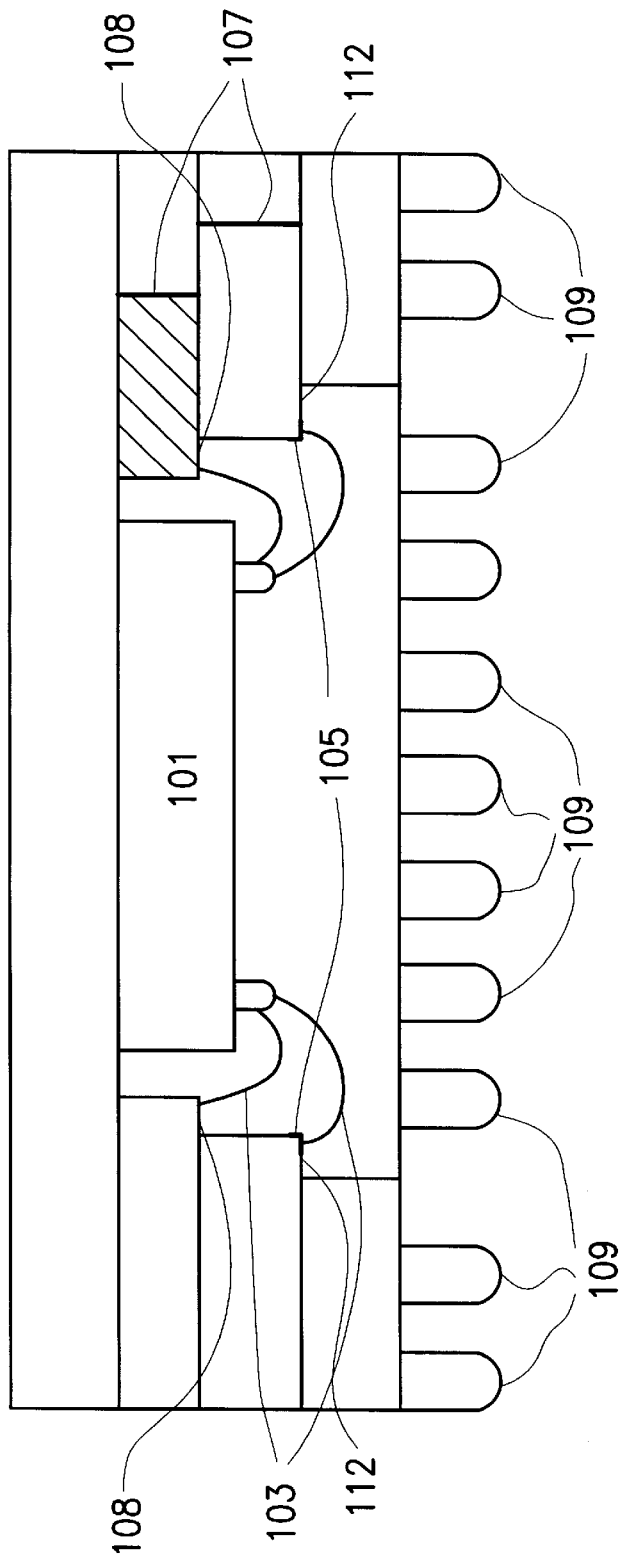
FIG. 1 is a cross-section showing a first conventional package structure.
Figure 1A:
FIG. 1a is a magnified view showing the conductive layer of the first conventional package structure as shown in FIG. 1.
Figure 2:
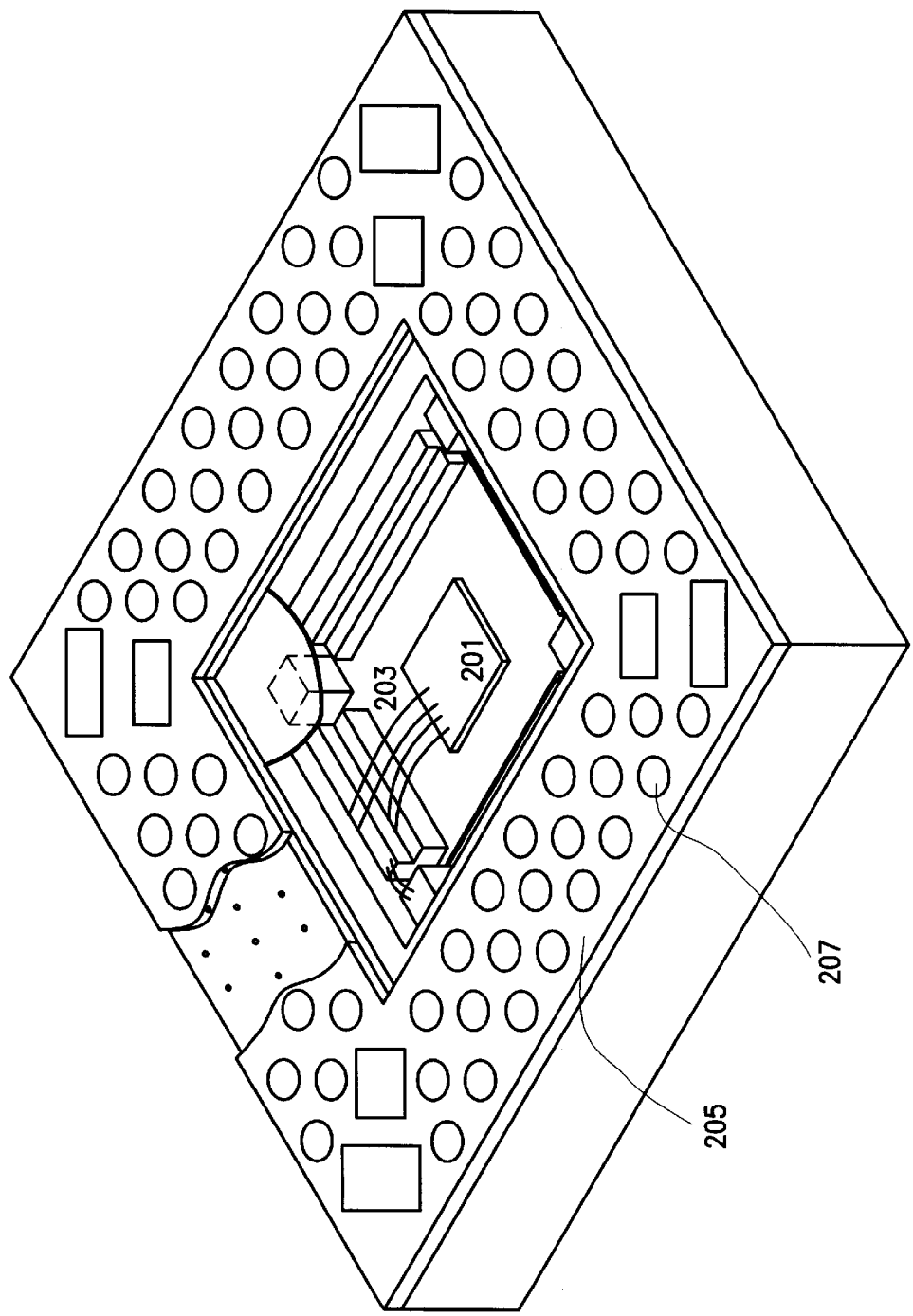
FIG. 2 is a perspective view showing a second conventional package structure.
Figure 3:
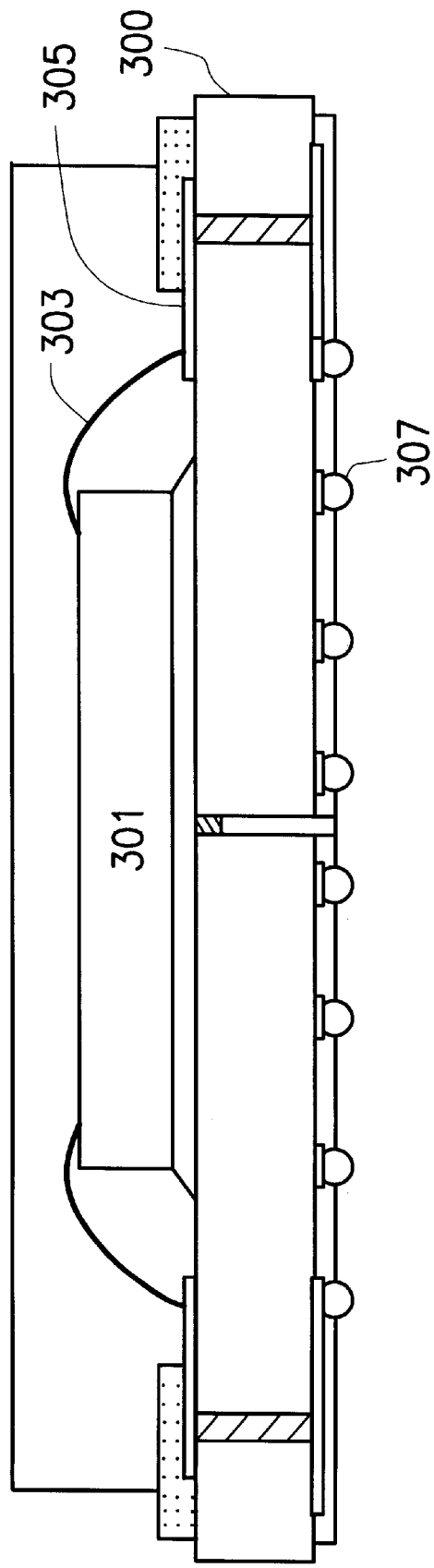
FIG. 3 is a cross-sectional view showing a third conventional package structure.

Reference will now be made in detail to the present preferred embodiments of the invention, examples of which are illustrated in the accompanying drawings. Wherever possible, the same reference numbers are used in the drawings and the description to refer to the same or like parts.

This invention provides a method of forming a thermal conductive structure on a printed circuit board so that a heat source has direct or almost direct contact with an efficient thermal conductive path. Nowadays, in an era where the electronic products must be highly precise, slim, light and have good heat dissipation, the printed circuit board structure formed by the method of this invention is capable of meeting some of these demands. The techniques used in this invention are different from the conventional method. This invention utilizes the formation of a highly irregular surface on a heat spreader, that is, a heat spreader having an embossed surface. Furthermore, a chip mount pad for carrying a silicon chip is in direct contact or almost direct contact with the heat spreader. Hence, the thermal conductive path dissipating heat is reduced considerably and the resulting heat dissipation is very much faster. Since no extra material is required for forming these structures and the method of fabrication quite simple, the structure can be mass-produced at a very low cost.

Figure 4:
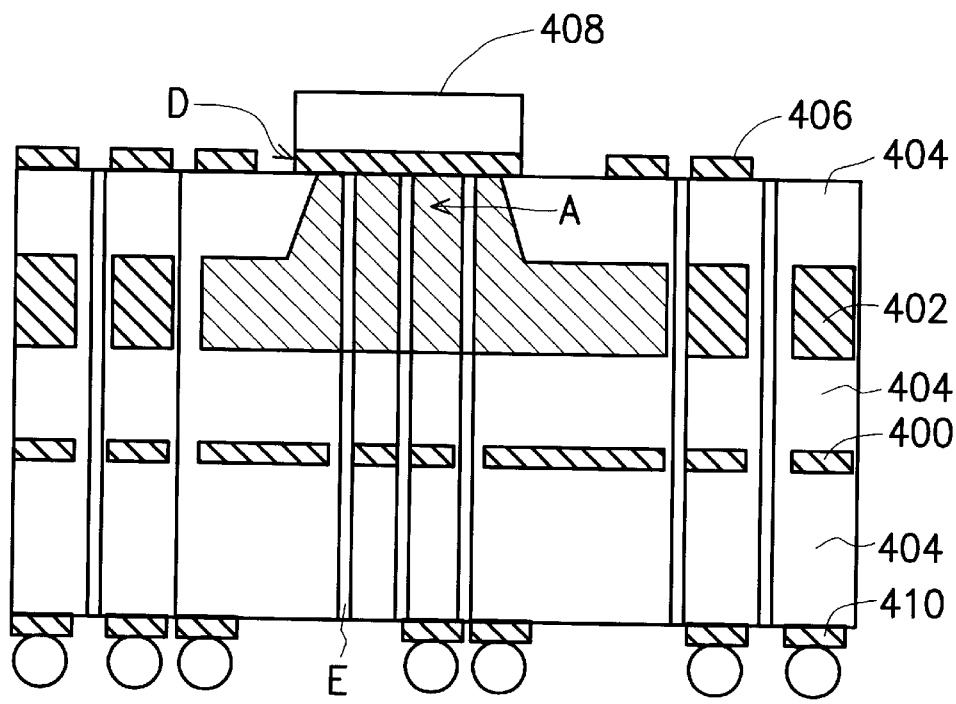
FIG. 4 is a cross-sectional view showing a package structure according to one preferred embodiment of this invention.
Figure 5:
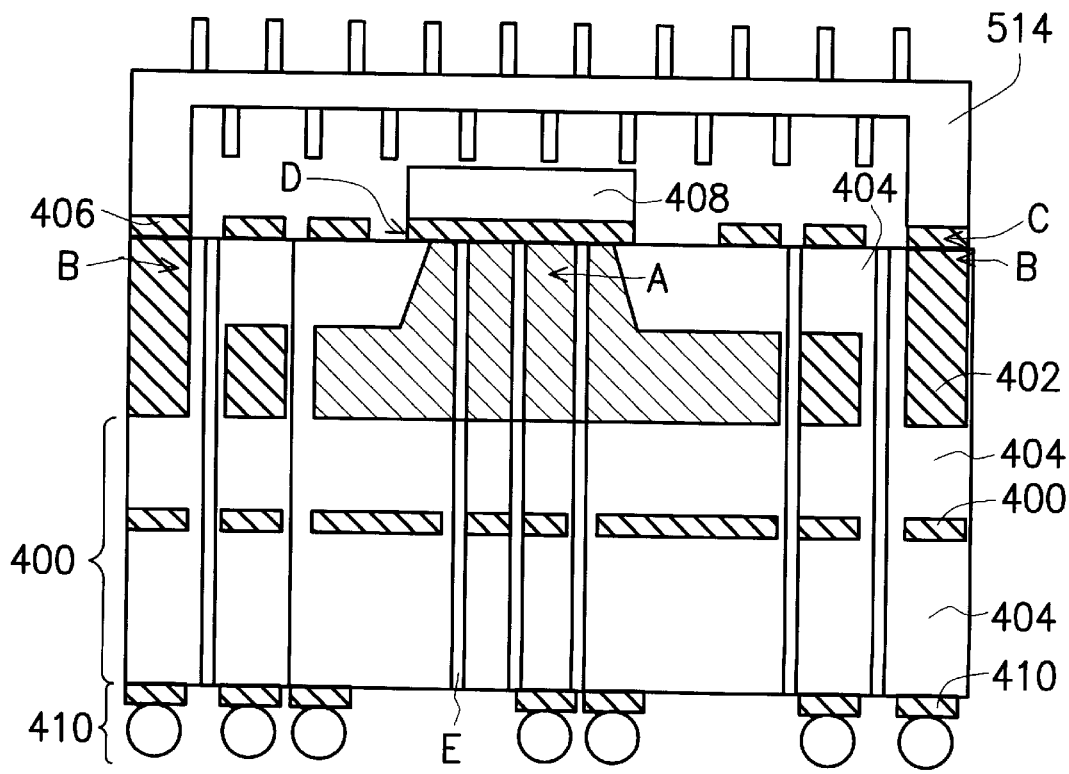
FIG. 5 is a cross-sectional view showing a package structure having an additional external heat sink according to one preferred embodiment of this invention.

FIG. 4 is a cross-sectional view showing a package structure according to one preferred embodiment of this invention. The thermal conductive path in a printed circuit board is shown in FIG. 4. First, as shown in FIG. 4, a pattern is formed on the surface of a heat spreader. Next, using a vacuum compression method, various metallic layers (400, 406, 410) with a plastic sheet (Prepreg) and epoxy in between are pressed together in separate operations. Thereafter, using photolithographic and etching methods, the structures as shown in FIGS. 4 and 5 are formed. The heat spreader 402 can be made from material such as metal, ceramics, or polymer. If the heat spreader 402 is made of metal, the pattern embossed surface on the heat spreader 402 can be fabricated according to the actual conditions using one of the following methods:

1. A mechanical drill is used to bore through-holes, and then a punch press is used to form a rough, embossed surface.

2. The metallic layer is drilled to form through-holes, and then the surface of the metallic layer is etched to form a pattern using photolithographic and chemical etching methods.

3. Photolithographic and etching methods are used to form through-holes in the metallic layer, and then a punch press is used to form an embossed surface, similar to that described in method 1, above.

4. Photolithographic and etching methods are employed twice to form the respective through-holes and pattern the surface of a metallic layer.

On the other hand, if the material for forming the heat spreader 402 is ceramic or polymer, a molding method can be used to form the irregular embossed pattern on its surface.

Figure 6:
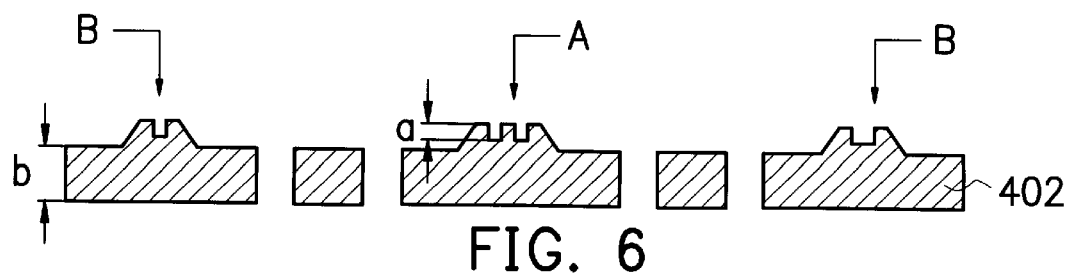
FIG. 6 is a cross-sectional view showing the heat spreaded of the package structure as shown in FIGS. 4 and 5.

FIG. 6 is a cross-sectional view showing the heat spreader 402 of the package structure as shown in FIGS. 4 and 5. As shown in FIG. 6, the metallic layer 402 has a thickness of about 5 mil to 12 mil, depth of the recessed cavities a is kept between 0.5–2.5 mil while depth of the recessed cavities b is kept between 2.0–4.5 mil. The metallic layers are assembled together using adhesive glue sheets with a thickness of 2–4.5 mil or resin-coated copper plates. The adhesive glue layer can be one of the materials that include, for example, Fr-4, Fr-5, Bismalemide Triazine (BT-Prepreg) or polyphenylene ether (PPE), for example. By compressing a glue layer 404 with a metallic layer in a vacuum, one after another, a complete stack having an adhesive glue layer 404 between the surface metallic layer 406, the heat spreader 402, the metallic layer 400 and the metallic layer 410 is formed. Alternatively, a resin-coated copper plate can be used as a substitute for the metallic layer 406 and the adhesive glue layer 404. In real applications, a portion of the metallic layer 406 (such as region A in FIGS. 4 and 5) is in direct contact or almost direct contact with the heat spreader 402 below. The surface above the contacting A region of the metallic layer 406 forms a chip mount pad (region D in FIGS. 4 and 5). The chip mount pad is a place for mounting a silicon chip 408. Regions A and D form a good thermal conductive pathway due to direct or almost direct contact with a heat spreader 402. Moreover, conventional thermal vias are also formed underneath the chip mount pad (as shown in region E of FIGS. 4 and 5). Therefore, heat generated by the silicon chip can be more readily transferred from the carrier to its bond-attached motherboard outside.

Because the silicon chip 408 is directly attached to the chip mount pad (region D) of the surface metallic layer 406, where the surface metallic layer 406 is in direct contact or almost direct contact with the heat spreader 402, heat conductive path is direct and short. The embossed portion A of the heat spreader 402 increases the surface area so that the metallic layer 406 can tightly adhere to the heat spreader 402. Furthermore, the increased surface area of the embossed portion A of the heat spreader 402 also provides much greater thermal dissipation. Therefore, the thermal dissipation efficiency increases. Accordingly, the thermal conductive path provided by the present invention is down to the heat spreader. Hence, heat generated by the silicon chip 408 is able to dissipate with minimal thermal resistance and without having to add in extra materials or increase production cost.

FIG. 5 is a cross-sectional view showing a package structure having an additional external heat sink 514 according to one preferred embodiment of this invention. Methods similar to the one described in FIG. 4 are used to form a printed circuit board. The printed circuit board includes a connection structure for connecting external devices or terminals such as a BGA, a conductive wire layer or a multi-layered core layer 400, a heat spreader 402 with a pattern-embossed surface tightly attached to the top of the conductive wire layer 400.

The edge of this heat spreader 402 also has an additional embossed pattern (the B region in FIG. 5), an adhesive glue layer 404, and a metallic layer 406 press-joined to the heat spreader 402 or the adhesive glue layer. A portion A of the heat spreader 406 is in direct contact or almost direct contact with the region D of the metallic layer 406. A silicon chip 408 attached to the top surface of the metallic layer 406, and then the chip 408 is wire bonded before being enclosed within a plastic package. Subsequently, a heat sink 514 is attached to the surface metallic layer 406 either by a thermal glue or thermal epoxy, or mechanically by screws. The attachment is made such that the edges of the heat sink 514 are in direct contact or almost in direct contact with metal pads in the C regions of the metallic layer 406. The metal pads in the C regions are copper pads better known as thermal pads, which can provide good thermal conductivity.

In FIG. 5, besides having a direct or almost direct heat dissipation pathways through the heat spreader 402 as shown in FIG. 4, a heat sink is further added by attaching it through the C and B regions that surround the silicon chip. The embossed portion A and B of the heat spreader 402 (shown in FIG. 6) also increases the surface area so that the metallic layer 406 can tightly adhere to the heat spreader 402. Furthermore, the increased surface area of the embossed portion A and B of the heat spreader 402 also provide much greater thermal dissipation. Therefore, the thermal dissipation efficiency increases. As a result, the complete thermal conductive path is that heat generated by the chip 408 is conducted down to the heat spreader 402 and then up to the heat sink 514 through the interface of the heat sink 514 and the embossed portion B of the heat spreader 402. Therefore, heat dissipation from the silicon chip is further facilitated. Furthermore, the method of installing a heat sink on top of the printed circuit board is simple. In other words, heat can be dissipated from the silicon chip much faster without increasing manufacturing difficulties.

Figure 7:
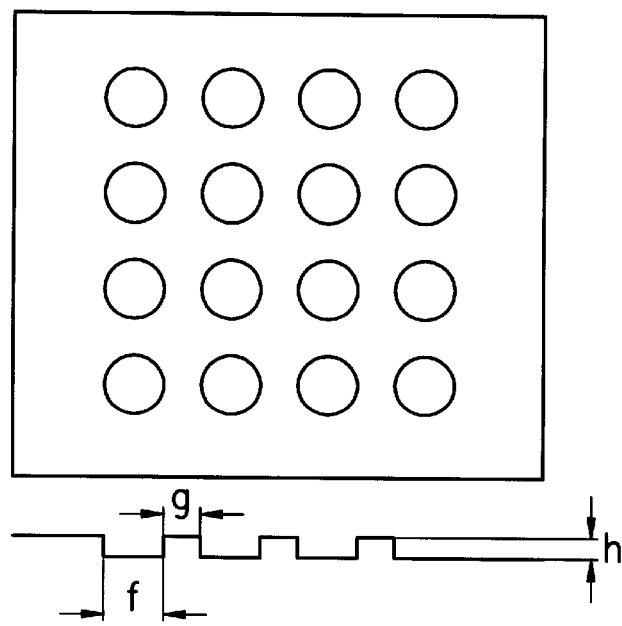
FIG. 7 is a top view of an embossed portion of a heat spreader showing recessed cavities on its surface according to one preferred embodiment of this invention.

FIG. 7 is a top view of an embossed portion of a heat spreader 402 showing recessed cavities on its surface according to one preferred embodiment of this invention. The recessed cavities surface structure as shown in FIG. 7 can apply to both portion A and B of FIG. 6. As shown in FIG. 7, the pattern formed by the recessed cavities on the heat spreader can be classified as array type, staggered type or irregular type. Preferably, the diameter f of the recessed structure is about 6–50 mil, and the distance of separation g between two neighboring recessed cavities is about 6–200 mil. Furthermore, the depth h of the recessed structure is preferably about 0.5–2.5 mil. Nevertheless, actual sizes should reflect the actual dimensions of a particular component.

Figure 8:
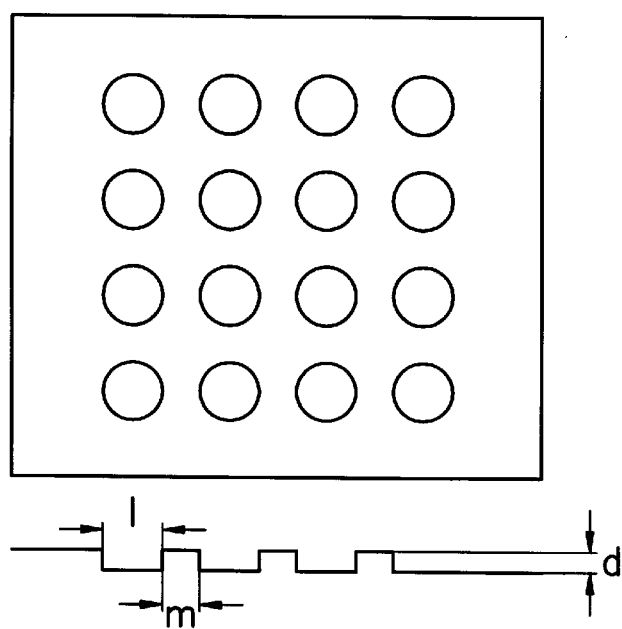
FIG. 8 is a top view of an embossed portion of a heat spreader, showing protruding pads on its surface, according to another preferred embodiment of this invention.

FIG. 8 is a top view of an embossed portion of a heat spreader 402 showing protruding pads on its surface according to another preferred embodiment of this invention. The protruding surface structure as shown in FIG. 8 can apply to both portion A and B of FIG. 6. As shown in FIG. 8, pattern formed by the the protruding portions on the heat spreader can be classified as array type, staggered type or irregular type. Preferably, the diameter k of the protruding structure is about 3–100 mil, and the distance of separation m between two neighboring protruding structures is about 6–200 mil.

Furthermore, the depth d of the protruding structure is preferably about 0.5–2.5 mil. Nevertheless, actual sizes should reflect the actual dimensions of a particular component. However, one must be cautious not to design a protruding structure with a diameter that is too small, because the protruding structure may easily break or crack.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a thermal conductive structure on a printed circuit board (PCB), comprising the steps of:
    attaching a heat spreader formed on the printed circuitboard;
    forming an embossed pattern on a portion of the surface of the heat spreader;
    forming an adhesive glue layer over the heat spreader; and
    attaching a surface metallic layer to the heat spreader and the adhesive glue layer, and a portion of the surface metallic layer is in direct contact or almost direct contact with the embossed portion of the surface of the heat spreader, wherein the portion of the surface metallic layer contacted to the embossed portion of the surface of the heat.

2. The method of claim 1, wherein the heat spreader is formed from a material which includes a metallic layer.

3. The method of claim 2, wherein the step of forming an embossed pattern on the metallic heat spreader further includes drilling through holes in it before using a punch press to form the embossed pattern on its surface.

4. The method of claim 2, wherein the step of forming an embossed pattern on the metallic heat spreader further includes drilling through holes in it before using photolithographic and etching methods to form the embossed pattern on its surface.

5. The method of claim 2, wherein the step of forming an embossed pattern on the metallic heat spreader further includes using photolithographic and etching methods to form a plurality of through holes before using a punch press to form the embossed pattern on its surface.

6. The method of claim 2, wherein the step of forming an embossed pattern on the metallic heat spreader further includes using photolithographic and etching methods to form a plurality of through holes before using the same method to form the embossed pattern on its surface.

7. The method of claim 1, wherein the heat spreader is formed from a material which includes a ceramic layer.

8. The method of claim 7, wherein the step of forming an embossed pattern on the ceramic heat spreader includes a molding method.

9. The method of claim 1, wherein material for forming the heat spreader includes a polymer layer.

10. The method of claim 9, wherein the step of forming an embossed pattern on the polymer heat spreader includes a molding method.

11. The method of claim 1, wherein the thermal spreader is pressed against and bonded to one side of a conductive wire layer or one side of a multi-layered stack.

12. The method of claim 11, wherein the other side of the conductive wire layer or the multi-layered stack has an externally connected structure.

13. The method of claim 1, wherein the step of attaching the surface metallic layer to the heat spreader includes using vacuum pressure.

14. The method of claim 1, wherein the step of attaching the surface metallic layer to the heat spreader includes using a hot adhesive glue and pressure.

15. The method of claim 1, further comprising a step of attaching a silicon chip to a chip mount pad region on the top surface of the surface metallic layer, where corresponding to the embossed pattern of the heat spreader.

16. A method of manufacturing a thermal conductive structure on a printed circuit board (PCB), the method comprising the steps of:
    attaching a heat spreader formed on the printed circuit board;
    forming a first embossed pattern on a portion of the surface of the heat spreader;
    forming a second embossed pattern on the edge portion of the surface of the heat spreader;
    forming an adhesive glue layer over the heat spreader;
    attaching a surface metallic layer to the heat spreader and the adhesive glue layer, wherein a portion of the surface metallic layer is in direct contact or almost direct contact with the first and the second embossed portions of the heat spreader; and
    mounting an external heat sink on top of the surface metallic layer where corresponding to the second embossed pattern of the edge of the heat spreader.

17. The method of claim 16, wherein material for forming the heat spreader includes a metallic layer.

18. The method of claim 16, wherein the step of forming an embossed pattern on the metallic heat spreader further includes drilling through holes in it before using a punch press to form the embossed pattern on its surface.

19. The method of claim 16, wherein the step of forming an embossed pattern on the metallic heat spreader further includes drilling through holes in it before using photolithographic and etching methods to form the embossed pattern on its surface.

20. The method of claim 16, wherein the step of forming an embossed pattern on the metallic heat spreader further includes using photolithographic and etching methods to form a plurality of through holes before using a punch press to form the embossed pattern on its surface.

21. The method of claim 16, wherein the step of forming an embossed pattern on the metallic heat spreader further includes using photolithographic and etching methods to form a plurality of through holes before using the same method to form the embossed pattern on its surface.

22. The method of claim 16, wherein material for forming the heat spreader includes a ceramic layer.

23. The method of claim 22, wherein the step of forming an embossed pattern on the ceramic heat spreader includes a molding method.

24. The method of claim 16, wherein the heat spreader is formed from a material which includes a polymer layer.

25. The method of claim 24, wherein the step of forming an embossed pattern on the polymer heat spreader includes a molding method.

26. The method of claim 16, wherein the thermal spreader is pressed against and bonded to one side of a conductive wire layer or one side of a multi-layered stack.

27. The method of claim 26, wherein the other side of the conductive wire layer or the multi-layered stack has an externally connected structure.

28. The method of claim 16, wherein the step of attaching the surface metallic layer to the heat spreader includes using vacuum pressure.

29. The method of claim 16, wherein the step of attaching the surface metallic layer to the heat spreader includes using a hot adhesive glue and pressure.

30. The method of claim 16, further comprising a step of attaching a silicon chip to a chip mount pad region on the top surface of the surface metallic layer, where corresponding to the first embossed pattern of the heat spreader.

31. The method of claim 16, further comprising a step of forming a heat sink pads on the top surface of the surface metallic layer, where corresponding to the second embossed pattern of the edge of the heat spreader before the heat sink mounted.

* * * * *